US008339892B2

(12) United States Patent
Kishibe

(10) Patent No.: US 8,339,892 B2
(45) Date of Patent: Dec. 25, 2012

(54) SEMICONDUCTOR MEMORY DEVICE

(75) Inventor: Hiroshi Kishibe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 113 days.

(21) Appl. No.: 12/966,610

(22) Filed: Dec. 13, 2010

(65) Prior Publication Data

US 2011/0141838 A1    Jun. 16, 2011

(30) Foreign Application Priority Data

Dec. 14, 2009    (JP) .................................. 2009-282725

(51) Int. Cl.
G11C 5/14    (2006.01)
(52) U.S. Cl. ....................................... 365/226; 365/227
(58) Field of Classification Search .................... 365/226
See application file for complete search history.

(56) References Cited

U.S. PATENT DOCUMENTS

| 5,615,162 | A  | * | 3/1997 | Houston ........................ 365/226 |
| 5,724,297 | A  | * | 3/1998 | Noda et al. .................... 365/226 |
| 5,894,433 | A  | * | 4/1999 | Itoh et al. ...................... 365/154 |
| 6,188,628 | B1 | * | 2/2001 | Tomotani ...................... 365/226 |
| 6,657,911 | B2 | * | 12/2003 | Yamaoka et al. ............. 365/226 |
| 6,914,845 | B2 | * | 7/2005 | Ooishi .......................... 365/229 |
| 7,031,220 | B2 | * | 4/2006 | Watanabe et al. ............. 365/226 |
| 7,630,229 | B2 | * | 12/2009 | Katayama ...................... 365/154 |
| 7,961,545 | B2 | * | 6/2011 | Yamaoka et al. ............. 365/226 |
| 7,978,562 | B2 | * | 7/2011 | Yabe et al. ............... 365/230.06 |
| 2010/0188922 | A1 | * | 7/2010 | Nakaoka ....................... 365/227 |
| 2010/0254209 | A1 | * | 10/2010 | Lee et al. ...................... 365/226 |

FOREIGN PATENT DOCUMENTS

| JP | 07-254284 A | 10/1995 |
| JP | 09-231756 A | 9/1997 |

* cited by examiner

Primary Examiner — Son Mai
(74) Attorney, Agent, or Firm — Sughrue Mion, PLLC

(57) ABSTRACT

A semiconductor memory device pertaining to the present invention includes a plurality of memory macros having memory cells and memory peripheral circuits which drive the memory cells; first power supply switches which control power supply to the memory cells; and a second power supply switch which controls power supply to the memory peripheral circuits. The first power supply switches are located within the memory macros, respectively, and provided between a power supply line feeding power to the memory cells and the memory cells. The second power supply switch is located outside the memory macros and provided between the power supply line and a common power supply wiring for the memory peripheral circuits in the plurality of memory macros.

11 Claims, 5 Drawing Sheets

SEMICONDUCTOR MEMORY DEVICE

CROSS-REFERENCE TO RELATED APPLICATIONS

The disclosure of Japanese Patent Application No. 2009-282725 filed on Dec. 14, 2009 including the specification, drawings and abstract is incorporated herein by reference in its entirety.

BACKGROUND OF THE INVENTION

1. Field of the Invention

The present invention relates to a semiconductor memory device and, particularly, to a semiconductor memory device comprising a plurality of memory macros.

2. Description of Related Art

Normally, electronic devices such as computers include data storage means for storing data. SRAM (Static Random Access Memory) is one of semiconductor memory devices which are used as the data storage means. SRAM has advantages in terms of high-speed operation, e.g., it does not require a refresh operation, and access time taken for access to a memory cell is short.

Japanese Unexamined Patent Publication No. Hei 7 (1995)-254284 discloses a technology relating to a semiconductor memory device which enables high-speed write and read operations and can reduce power consumption during an inactive state. FIG. 5 is a block diagram depicting the semiconductor memory device pertaining to Japanese Unexamined Patent Publication No. Hei 7 (1995)-254284. The semiconductor memory device shown in FIG. 5 comprises a memory cell array 101, a memory peripheral circuit 102, a power supply line 103 coupled to a power supply voltage VCC, a pseudo power supply line 131 of the memory peripheral circuit 102, a ground line 104, memory cells 105, word lines WL, and bit lines BL. The pseudo power supply line 131 is coupled to the power supply line 103 via a switch SW1.

The memory peripheral circuit 102 is comprised of MOS transistors having a low threshold voltage to implement high-speed data read and write operations. The power supply voltage VCC is supplied through divergent paths to the memory cell array 101 and the memory peripheral circuit 102. The power supply voltage is always supplied to the memory cell array 101 through the power supply line 103 to retain data stored in cells. On the other hand, in the path to the memory peripheral circuit 102, a switch SW1 is provided between the power supply line 103 and the pseudo power supply line 131 which is a power supply line internal to the memory peripheral circuit 102. By controlling this switch to be on, the power supply voltage VCC is supplied to the memory peripheral circuit 102 and the semiconductor memory device turns from an inactive state to an active state, enabling data write and read operations.

When the semiconductor memory device is in the active state, the switch SW1 is on and the power supply voltage VCC is supplied to the memory peripheral circuit 102 and high-speed write and read are performed by the memory peripheral circuit 102 comprised of MOS transistors. When in the inactive state, the switch SW1 is off, thereby stopping the supply of the power supply voltage VCC to the memory peripheral circuit 102 and inhibiting power consumption of the memory peripheral circuit 102. In this way, in the semiconductor memory device pertaining to Japanese Unexamined Patent Publication No. Hei 7 (1995)-254284, by making the switch SW1 remain off when the semiconductor memory device is in the inactive state, it is possible to stop the power supply to the memory peripheral circuit 102. Thus, the power consumption of the semiconductor memory device can be suppressed.

Generally, in a semiconductor memory device using a CMOS integrated circuit, increasing the circuit size results in an increase in parasitic capacitance of an internal power supply line of the semiconductor memory device. For example, consider a case where a switch MOSFET is provided between the power supply line for supplying an external power supply to the semiconductor memory device and the internal power supply line of the semiconductor memory device and power supply to the semiconductor memory device is controlled by means of the switch MOSFET. If the circuit size increases, the parasitic capacitance of the internal power supply line increases and, in consequence, when the switch MOSFET is turned on, a large current (hereinafter, referred to as an inrush current) will flow through it. This inrush current comprises a current needed to charge up a large gate capacitance of the switch MOSFET and a current to charge up the parasitic capacitance of the internal power supply line through a source-drain path of the switch MOSFET. This inrush current increases with an increase in the size of the CMOS circuit like the one mentioned above.

Such inrush current raises a peak current value of the semiconductor memory device and the current capacity of a power supply device to be installed in the system must be large enough to accommodate the peak current value. Even for the semiconductor memory device, the occurrence of such inrush current introduces a large noise in the power supply line, which deteriorates its operation margin.

Japanese Unexamined Patent Publication No. Hei 9 (1997)-231756 discloses a technology relating to a semiconductor memory device which can solve the above-noted problem. The semiconductor memory device disclosed in Japanese Unexamined Patent Publication No. Hei 9 (1997)-231756 comprises a power supply line carrying an operating voltage VCC supplied from an external terminal, a plurality of circuit blocks, each adapted to perform a circuit operation by an operation control signal, internal power supply lines, each provided for each of the circuit blocks, switches MOSFET, each provided between the power supply line and each of the internal power supply lines of the circuit blocks, and a power supply switch circuit adapted to control switching of each of the switches MOSFET by using the operation control signal. Sequentially delayed operation control signals are applied to the gates of the switches MOSFET respectively provided for the circuit blocks. Thus, on-off switching of each of these switches is controlled to occur at different timing.

The semiconductor memory device disclosed in Japanese Unexamined Patent Publication No. Hei 9 (1997)-231756 is configured to shift the timing to turn on each of the switches MOSFET respectively provided for the circuit blocks. Accordingly, an inrush current occurs at different times and, thus, the peak current value can be reduced, as compared with a case where the circuit blocks are activated simultaneously.

SUMMARY

In the semiconductor memory device pertaining to the above-mentioned Japanese Unexamined Patent Publication No. Hei 7 (1995)-254284, the switch SW1 is provided between the pseudo power supply line 131 which is a power supply line internal to the memory peripheral circuit 102 and the power supply line 103. Therefore, considering a case where the invention of Japanese Unexamined Patent Publication No. Hei 7 (1995)-254284 is applied to a semiconductor memory device having a plurality of memory macros, a given number of switches need to be provided for each of the memory peripheral circuits in the memory macros. This poses a problem in which the area required to mount switch circuits increases in proportion to the number of the memory peripheral circuits in the memory macros.

A semiconductor memory device according to an aspect of the present invention includes a plurality of memory macros having memory cells and memory peripheral circuits which drive the memory cells; first power supply switches which control power supply to the memory cells; and a second power supply switch which controls power supply to the memory peripheral circuits. The first power supply switches are located within the memory macros, respectively, and provided between a power supply line feeding power to the memory cells and the memory cells. The second power supply switch is located outside the memory macros and provided between the power supply line and a common power supply wiring for the memory peripheral circuits in the plurality of memory macros.

In the semiconductor memory device according to another aspect of the present invention, the second power supply switch which controls power supply to the memory peripheral circuits is located outside the memory macros and the second power supply is provided between the power supply line and the common power supply wiring for the memory peripheral circuits in the plurality of memory macros. Therefore, the power supply switch having a current capacity to allow an amount of current consumed across the common power supply line for the memory peripheral circuits in the plurality of memory macros only needs to be provided. Thus, the mounting area for the switch can be reduced.

According to the present invention, it is possible to provide a semiconductor memory device in which it is feasible to reduce the mounting area occupied by the switch for feeding power to the memory peripheral circuits which drive the memory cells.

DETAILED DESCRIPTION OF THE EXEMPLARY EMBODIMENTS

First Exemplary Embodiment

Figure 1:
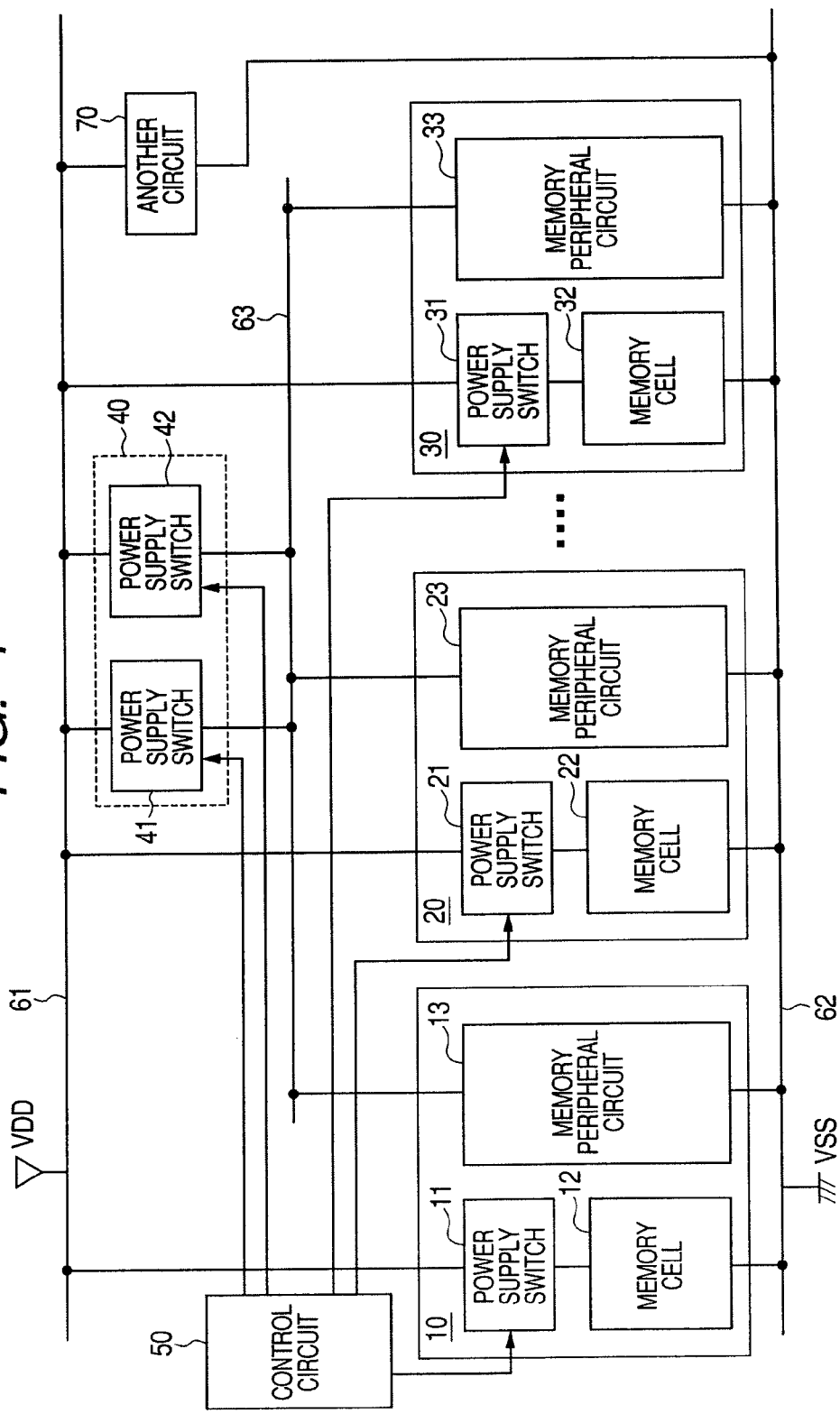
FIG. 1 is a block diagram depicting a semiconductor memory device pertaining to a first exemplary embodiment.

In the following, a first exemplary embodiment of the present invention will be described with reference to the drawings. FIG. 1 is a block diagram depicting a semiconductor memory device pertaining to the first exemplary embodiment. The semiconductor memory device shown in FIG. 1 comprises a plurality of memory macros 10 20 30 comprising memory cells 12, 22, 32 and memory peripheral circuits 13, 23, 33 which drive the memory cells, power supply switches (first power supply switches) 11, 21, 31 which control power supply to the memory cells 12, 22, 32, and a power supply switch (second power supply switch) 40 which controls power supply to the memory peripheral circuits 13, 23, 33.

The memory cells 12, 22, 32 are, for example, SRAM cells. Each of the memory cells 12, 22, 32 comprises a plurality of unit memory cells arranged in a matrix, a plurality of word lines wired along each of the rows of the unit memory cells, and a plurality of bit line pairs wired along each of the columns of the unit memory cells. One unit memory cell can be configured by using, for example, six MOS transistors. A unit memory cell using six MOS transistors can be configured with, for example, a flip-flop comprising a pair of CMOS inverters which are cross-coupled to each other and two access transistors which couple both nodes of the flip-flop to respective bit lines. On/off of the access transistors is controlled by a signal applied to the corresponding word line.

When writing data into a unit memory cell, electric potentials of opposite levels (L level and H level and vice versa) are applied to the bit line pair and, in this state, the word line is then activated to turn the access transistors on. This causes coupling both nodes located on each side of the flip-flop of the unit memory cell to the bit line pair, respectively. Data (electric potentials) on the bit line pair is written to both nodes of the flip-flop.

Inversely, when reading data written into a unit memory cell, the word line is activated to turn the access transistors on and both nodes of the flip-flop of the unit memory cell are then made coupled to the bit line pair, respectively. At this time, a voltage change in the bit line pair is detected by using a sense amplifier (not shown). Thereby, data written to both nodes of the flip-flop which is a main component of the unit memory cell can be read.

The memory peripheral circuits 13, 23, 33 apply a signal for writing data into and a signal for reading data from the memory cells 12, 22, 32 to the word lines and the bit line pairs of the memory cells 12, 22, 32. Each of the memory peripheral circuits 13, 23, 33 comprises, for example, a word line driver which activates or deactivates a word line, a precharge circuit which applies a precharge voltage to a bit line pair, a data driver which applies a voltage corresponding to data to be written into a memory cell to a bit line pair, a sense amplifier which detects and amplifies a electric potential difference between a bit line pair when reading data written into a memory cell, and others.

The power supply switches 11, 21, 31 are located within the memory macros 10, 20, 30, respectively, and provided between a power supply line 61 supplying a power supply voltage VDD to the memory cells 12, 22, 32 and the memory cells 12, 22, 32. The power supply switches 11, 21, 31 control turning on/off the conduction between the power supply line 61 and the memory cells 12, 22, 32, based on a control signal which is fed from a control circuit 50. The memory cells 12, 22, 32 is also coupled to a power supply line 62 of a ground electric potential VSS. MOSFETs are used for the power supply switches 11, 21, 31.

The power supply switch 40 is located outside the memory macros 10, 20, 30. The power supply switch 40 is provided between the power supply line 61 supplying a power supply voltage VDD and a common power supply wiring 63 for the memory peripheral circuits 13, 23, 33 in the plurality of memory macros. The power supply switch 40 controls turning on/off the conduction between the power supply line 61 and the memory peripheral circuits 13, 23, 33, based on a control signal which is fed from a control circuit 50. The power supply switch 40 for the memory peripheral circuits 13, 23, 33 can be configured with transistors having a capacity to allow a current which may flow across any number of memory peripheral circuits, if operating simultaneously, among the memory peripheral circuits 13, 23, 33. The memory peripheral circuits 13, 23, 33, are also coupled to the power supply line 62 of the ground electric potential VSS.

Here, in a preferred configuration example, the power supply switch 40 may comprise two power supply switches (a third power switch) 41 and (a fourth power switch) 42. In this case, for example, a power supply switch 41 can be configured with a transistor having a small current capacity in order to adjust a voltage rise time, whereas a power supply switch 42 can be configured with a transistor having a large current capacity, which is capable of passing a sufficient current required to operate the memory peripheral circuits 13, 23, 33.

Further, the power supply switch 42 may be divided into two or more transistors, if necessary, for ease of layout and for other reasons.

For example, the current capacity of the power supply switch 42 is determined, based on a current consumed across the operating memory peripheral circuits in the plurality of memory macros. This current value can be set smaller than a total sum of currents consumed by each memory peripheral circuit, when the memory peripheral circuit in each memory macro operates separately.

The control circuit 50 feeds a control signal for controlling power supply to the memory cells 12, 22, 32 to the power supply switches 11, 21, 31. The control circuit 50 also feeds a control signal for controlling power supply to the memory peripheral circuits 13, 23, 33, to the power supply switches 41, 42. Although the foregoing description discussed the case where three memory macros are provided in the semiconductor memory device pertaining to the first exemplary embodiment, the number of memory macros can be determined optionally.

Figure 2:
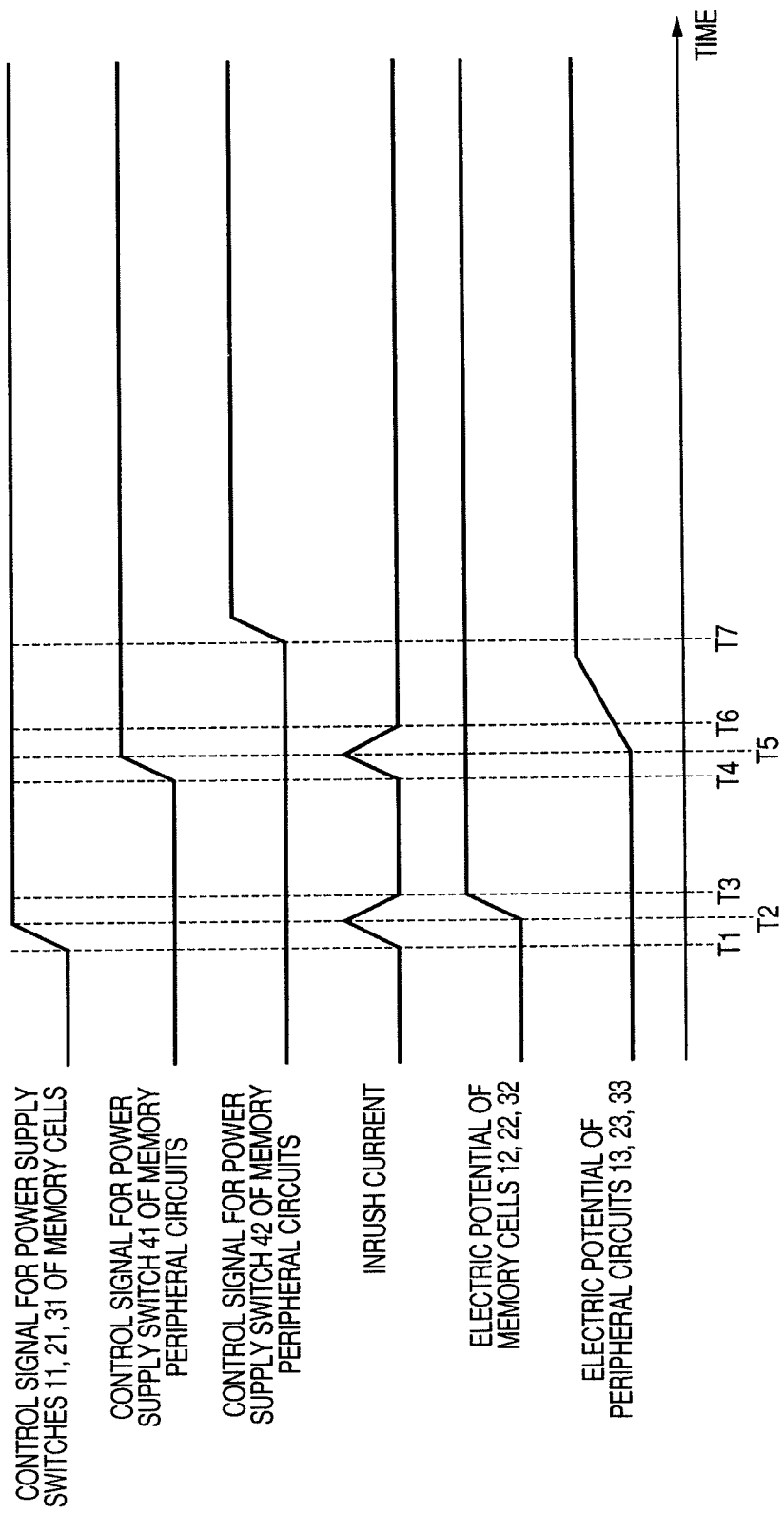
FIG. 2 is a timing chart relating to the operation of the semiconductor memory device pertaining to the first exemplary embodiment.

Then, the operation of the semiconductor memory device pertaining to the first exemplary embodiment is explained using FIG. 2. FIG. 2 is a timing chart to explain the operation of the semiconductor memory device pertaining to the first exemplary embodiment.

First, at timing of T1, the power supply switches 11, 21, 31 of the memory cells 12, 22, 32 are turned into a conducting state (on state). This couples the power supply line 61 feeding the power supply voltage VDD to the memory cells 12, 22, 32 and the power supply voltage VDD is supplied to the memory cells 12, 22, 32. At this time, an inrush current flows in the power supply switches 11, 21, and 31. This inrush current is the current for charging up the parasitic capacitance of the circuits configuring the memory cells 12, 22, 32. In the case that the power supply switches are configured with transistors, the transistors have a resistance component during their rise time. Hence, a voltage attributed to the inrush current and the resistance component is produced in the power supply switches 11, 21, 31. The voltage produced at this time introduces a noise in the power supply line and negatively affects another circuit 70 which is operating.

In this case, however, because the parasitic capacitance of the memory cells 12, 22, and 32 is small, the inrush current flowing in the power supply switches 11, 21, and 31 is small. Therefore, even if the power supply switches 11, 21, 31 of the memory cells 12, 22, and 32 are turned on at the same time, another circuit 70 which is operating is less affected.

At timing of T2, the inrush current flowing in the power supply switches 11, 21, and 31 becomes maximum and, then, starts to decrease. At timing of T2, the electric potential of the memory cells 12, 22, and 32 starts to rise. Then, at timing of T3, the inrush current flowing in the power supply switches 11, 21, and 31 becomes 0. Also, the electric potential of the memory cells 12, 22, 32 becomes constant.

Then, at timing of T4, the power supply switch 41 is turned on. Thereby, the power supply voltage VDD is supplied to the memory peripheral circuits 13, 23, 33. At this time, an inrush current flows in the power supply switch 41. This inrush current is the current for charging up the parasitic capacitance of the circuits configuring the memory peripheral circuits 13, 23, 33. In this case, however, because the power supply switch 41 is configured with a small size transistor, the inrush current flowing in the power supply switch 41 can be reduced. For example, the inrush current can be made as small as that occurring when a memory cell 12, 22, 32 having a small parasitic capacitance is turned on.

Then, at timing of T5, the inrush current flowing in the power supply switch 41 becomes maximum, and then starts to decrease. At timing of T5, the electric potential of the memory peripheral circuits 13, 23, and 33 starts to rise. Then, at timing of T6, the inrush current flowing in the power supply switch 41 becomes 0. At this time, the electric potential of the memory peripheral circuits 13, 23, 33 continues to rise.

Then, after the electric potential of the memory peripheral circuits 13, 23, 33 becomes constant, at timing of T7, the power supply switch 42 is turned on. Thereby, the power supply voltage VDD is supplied to the memory peripheral circuits 13, 23, 33 via the power supply switch 41 and the power supply switch 42. At timing of T7, because the electric potential of the memory peripheral circuits 13, 23, 33 becomes constant, that is, charging up the parasitic capacitance of the memory peripheral circuits 13, 23, 33 is complete, no inrush current flows in the power supply switch 42. Therefore, in this case, the power supply switch 42 can be configured with a large size transistor.

As described above, in the semiconductor memory device pertaining to the first exemplary embodiment, the power supply switch 40 which controls power supply to the memory peripheral circuits 13, 23, 33 is located outside the memory macros 10, 20, 30 and the power supply switch 40 is provided between the power supply line 61 and a common power supply wiring 63 for the memory peripheral circuits 13, 23, 33 in the plurality of memory macros. In addition, by setting the current capacity of the power supply switch 40 to an amount that allows a current consumed across the memory peripheral circuits 13, 23, 33, it is possible to reduce the mounting area occupied by the power supply switch 40 for feeding power to the memory peripheral circuits 13, 23, 33.

In the semiconductor memory device pertaining to Japanese Unexamined Patent Publication No. Hei 9 (1997)-231756, a delay circuit is used to delay the operation control signals to be applied to the gates of the switches MOSFET respectively provided for the circuit blocks, so that an inrush current occurs at different times. Due to this, it takes longer to activate memory macros, because the timing to turn each of the switches MOSFET on is shifted by the delay circuit in the semiconductor memory device pertaining to Japanese Unexamined Patent Publication No. Hei 9 (1997)-231756.

In contrast, in the semiconductor memory device pertaining to the first exemplary embodiment, the power supply switch 40 which controls power supply to the memory peripheral circuits 13, 23, 33 is provided between the power supply line 61 and the common power supply wiring 63 for the memory peripheral circuits 13, 23, 33 in the plurality of memory macros. Therefore, by turning the power supply switch 40 on, the memory peripheral circuits 13, 23, 33 can be activated at the same time. Thus, the time taken to activate the memory macros can also be shortened. Further, in the semiconductor memory device pertaining to the first exemplary embodiment, because the memory peripheral circuits 13, 23, and 33 share the power supply wiring 63, the decoupling effect due to the parasitic capacitance augments. Accordingly, a power supply noise becomes easy to absorb and the stability of operation is improved.

The description of the first exemplary embodiment discussed the case where the power supply switch which controls power supply to the memory peripheral circuits is provided outside the memory macros. However, the semiconductor memory device pertaining to the first exemplary embodiment may alternatively be configured such that, instead of the power supply switches 11, 21, 31 of the memory cells, a common power supply switch is provided outside the memory macros. That is, by providing a single power supply switch for the plurality of memory cells, it is possible to further reduce the circuit area.

In accordance with the semiconductor memory device pertaining to the first exemplary embodiment described as above, it is possible to provide a semiconductor memory device in which it is feasible to reduce the mounting area occupied by the switch for feeding power to the memory peripheral circuits which drive the memory cells.

Second Exemplary Embodiment

Figure 3:
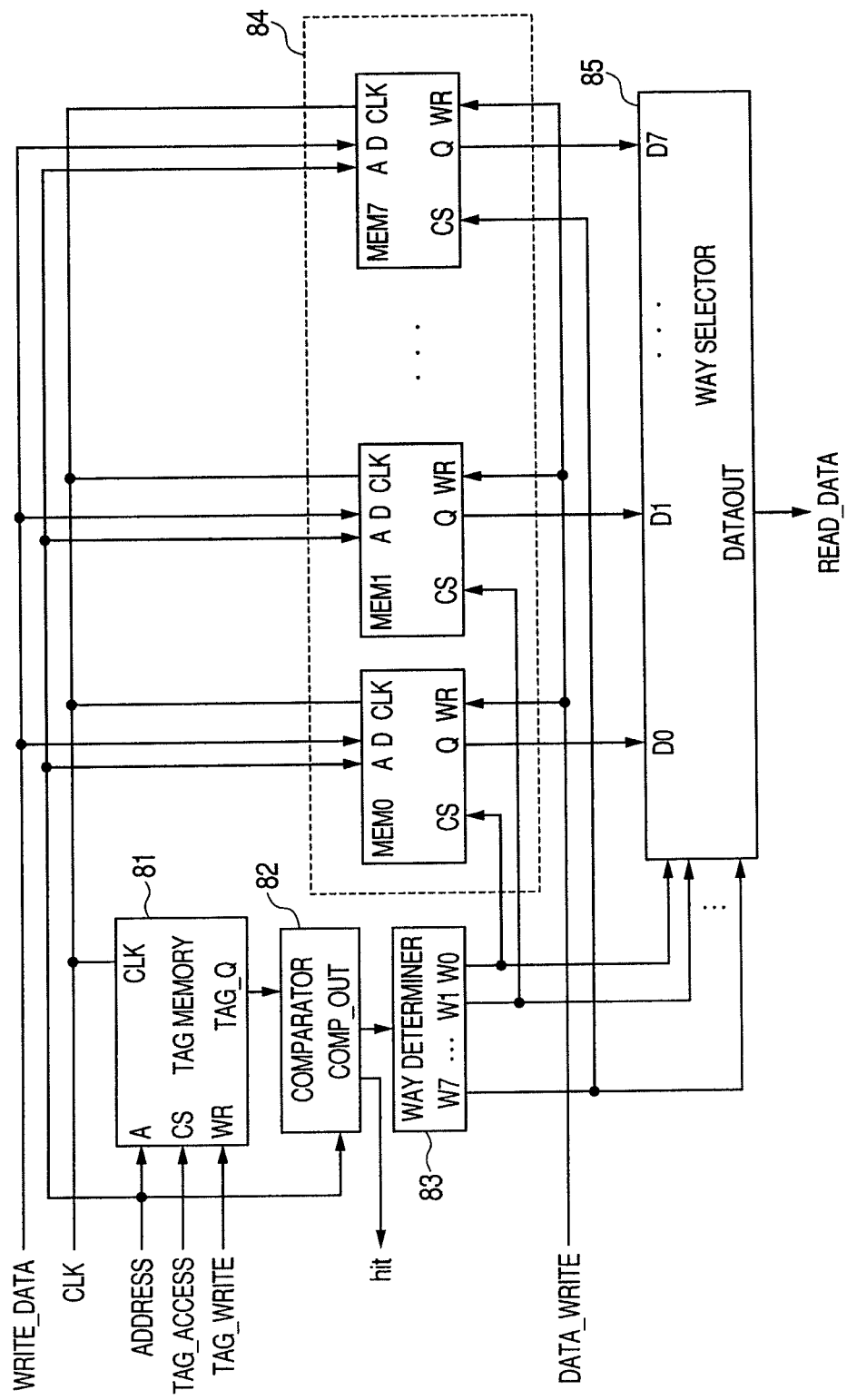
FIG. 3 is a block diagram depicting a semiconductor memory device pertaining to a second exemplary embodiment.

In the following, a second exemplary embodiment of the present invention will be described with reference to the drawings. FIG. 3 is a block diagram depicting a semiconductor memory device pertaining to the second exemplary embodiment. The semiconductor memory device pertaining to the second exemplary embodiment shown in FIG. 3 is a cache memory. The cache memory shown in FIG. 3 comprises a tag memory 81, a comparator 82, a way determiner 83, a data memory 84, and a way selector 85. Here, as the data memory 84, the semiconductor memory device (SRAM) described in the first exemplary embodiment can be used. That is, each of the memory macros 10, 20, 30 in the semiconductor memory device pertaining to the first exemplary embodiment corresponds to each of memory macros MEM0, MEM1, . . . , MEM7 in the cache memory pertaining to the second exemplary embodiment. The configuration of the data memory 84 can be regarded the same as the configuration of the semiconductor memory device pertaining to the first exemplary embodiment 1 shown in FIG. 1, although the power supply switches and the like to supply the power supply voltage to the memory cells and the memory peripheral circuits configuring the memory macros MEM0, MEM1, . . . , MEM7 are omitted from FIG. 3. The following description assumes a case where, by way of example, eight memory macros are provided in the cache memory pertaining to the second exemplary embodiment.

The data memory 84 is a memory for storing data corresponding to a subset of data which is stored in a main storage (not shown). The storage area of the data memory 84 is divided into eight ways physically or logically (i.e., memory macros MEM0, MEM1, . . . , MEM7). The memory macros may also be referred to as ways hereinafter. Each way is further managed in data storage units of a plurality of words which may also be referred to as lines. A data storage location in the data memory 84 is specified by decoding a lower part of an input address (ADDRESS) input from an address bus.

The tag memory 81 is a memory for storing a tag address corresponding to data which is stored on the line unit basis in the data memory 84. The tag memory 81 is accessed by an index address included in an input address and outputs a tag address (TAG_Q) specified by decoding the index address.

To the comparator 82, an input address (ADDRESS) input from the address bus and a tag address (TAG_Q) which is an output from the tag memory are input. The comparator 82 compares the input address (ADDRESS) and the tag address (TAG_Q) and outputs a comparison result (COMP_OUT). It also outputs a result of hit decision (hit) based on the comparison result. That is, the comparator 82 determines a match between the input address (ADDRESS) and the tag address (TAG_Q) as a cache hit and a mismatch as a mishit.

The way determiner 83 takes input of the comparison result (COMP_OUT) of the comparator 82 and, based on the comparison result, outputs a chip select signal (CS signal) to the data memory 84. The way determiner 83 also outputs a way select signal to the way selector 85. For example, if a match occurs between an input address (ADDRESS) corresponding to a way MEM0 and a tag address (TAG_Q), the way determiner 83 outputs a chip select signal (CS signal) to a chip select input (CS) of the way MEM0. At this time, the way MEM0 outputs data existing in a location corresponding to the input address (ADDRESS) to the way selector 85.

The way selector 85 takes inputs of a way select signal output from the way determiner 83 and data (D0, D1, . . . , D7) output from the data memory (ways MEM0, MEM1, . . . , MEM7) and outputs data corresponding to the way determined by the way determiner 83.

Figure 4:
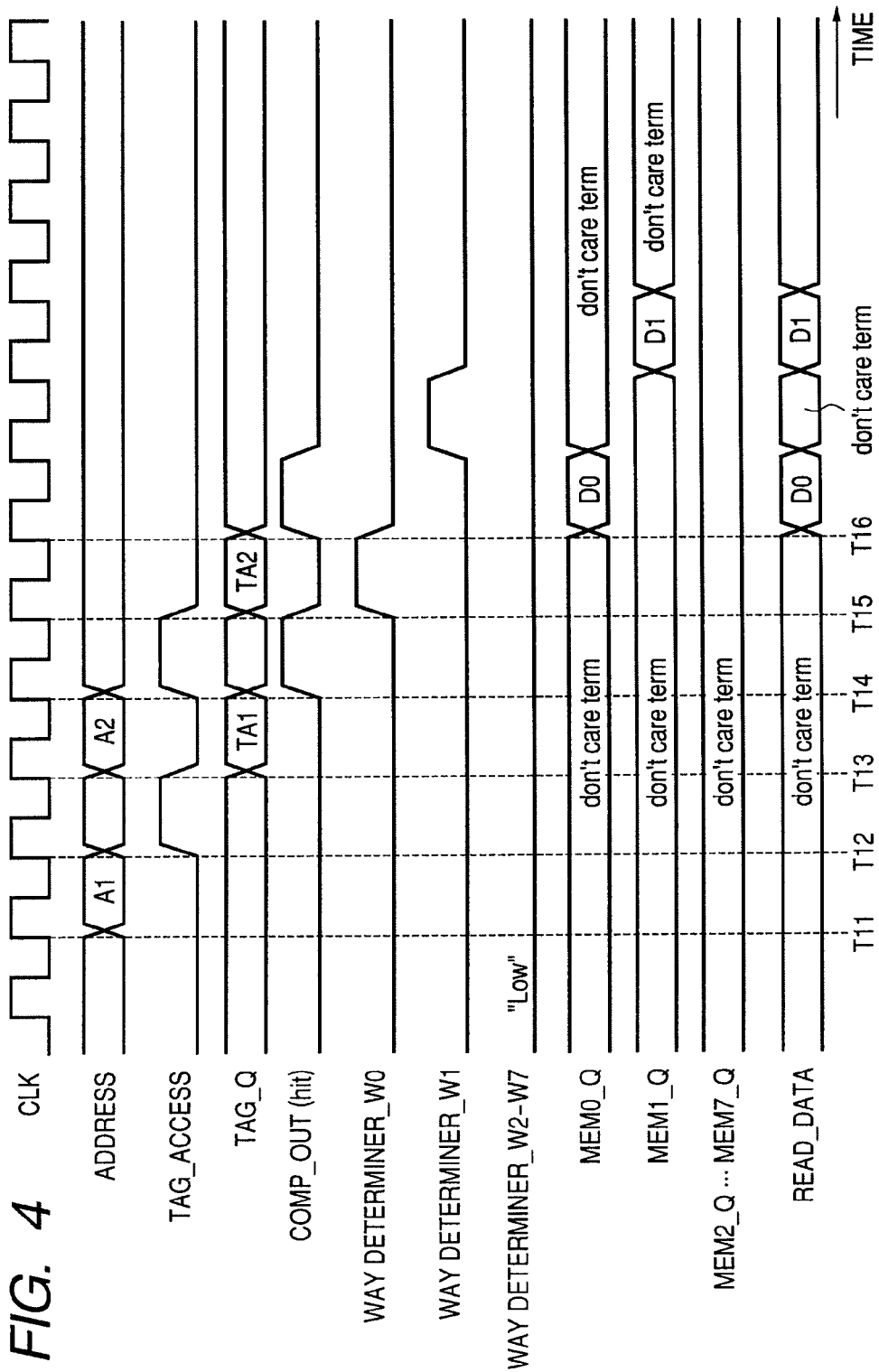
FIG. 4 is a timing chart relating to the operation of the semiconductor memory device pertaining to the second exemplary embodiment.
Figure 5:
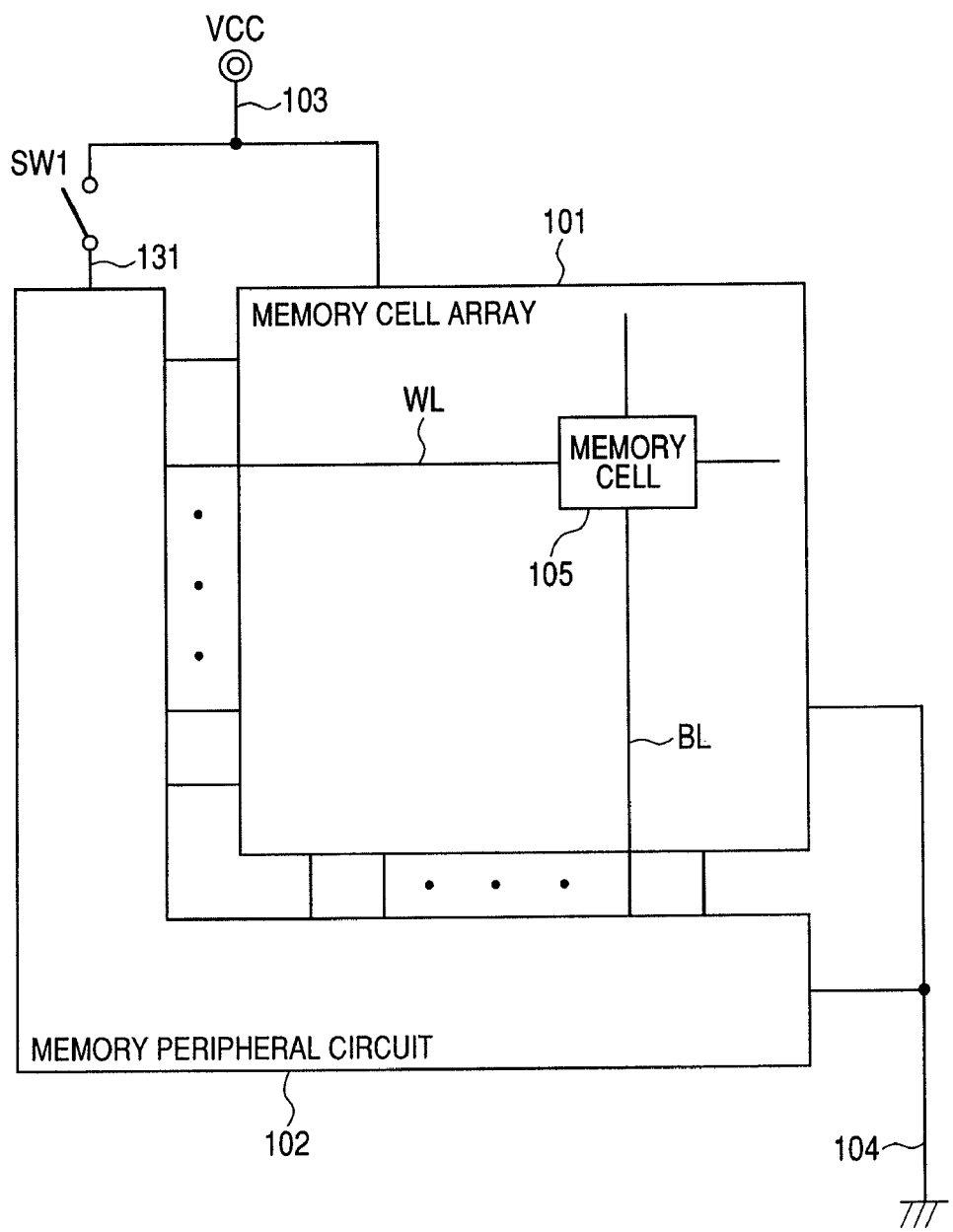
FIG. 5 is a block diagram depicting a semiconductor memory device pertaining to Japanese Unexamined Patent Publication No. Hei 7 (1995)-254284.

Then, the operation of the cache memory pertaining to the second exemplary embodiment shown in FIG. 3 is explained. FIG. 4 is a timing chart to explain the operation of the cache memory pertaining to the second exemplary embodiment. In the second exemplary embodiment, by way of example, a description is provided for an operation in which data (D0) existing in a location corresponding to an input address (A1) is output as read data.

First, at timing of T11, the input address (A1) is supplied to the tag memory 81, comparator 82, and data memory 84. Then, at timing of T12, a chip select signal (TAG_ACCESS) to activate the tag memory 81 is supplied to the tag memory 81. The tag memory 81 to which the chip select signal (TAG_ACCESS) was input outputs a specified tag address (TAG_Q:TA1) at timing of T13.

The comparator 82 compares the input address (A1) and the tag address (TA1) and outputs a comparison result (COMP_OUT) indicating a match at timing of T14. The comparator 82 also outputs a decision result (hit: cache hit in this case) at the timing of T14.

The way determiner 83 takes input of the comparison result (COMP_OUT) of the comparator 82 and outputs a chip select signal (CS signal) based on the comparison result to a way MEM0 at timing of T15. The way determiner 83 also outputs a way select signal to select the way MEM0 to the way selector 85 at the timing of T15.

The way MEM0, when taking input of the chip select signal (CS signal) output from the way determiner 83, outputs data (D0) to the way selector 85 at timing of T16. In turn, the data (D0) is output as read data (READ_DATA) from the way selector 85 at the timing of T16.

Also for outputting data (D1) existing in a location corresponding to an input address (A2) as read data, the same occurs as in the above operation and, hence, a redundant description is omitted.

In the cache memory pertaining to the second exemplary embodiment, the semiconductor memory device (SRAM) pertaining to the first exemplary embodiment shown in FIG. 1 is used as the data memory 84. During operation, the power supply voltage VDD is supplied to the memory cells 12, 22, 32 in the SRAM which is the data memory 84, as the power supply switches 11, 21, 31 are on. The power supply voltage VDD is also supplied to the memory peripheral circuits 13, 23, 33 in the SRAM which is the data memory 84, as the power supply switch 40 (power supply switches 41, 42) is on.

Here, in the cache memory pertaining to the second exemplary embodiment, only a way (memory macro) to which the chip select signal (CS signal) output from the way determiner 83 was supplied operates at a time, as can be seen in the timing chart of FIG. 4. Hence, a maximum current consumed across the memory peripheral circuits 13, 23, 33 in the memory macros is equivalent to a current consumed by the memory peripheral circuit in one memory macro that is now operating. Consequently, in the cache memory shown in FIG. 3, the current capacity of the power supply switch for feeding power to the memory peripheral circuits can be set smaller. Moreover, because there is no need for providing respective power supply switches for each of the memory peripheral circuits in the memory macros, the circuit area can be reduced.

Concretely speaking, given that a current of 5 mA is consumed by the memory peripheral circuit in one way (memory macro) that is operating, power supply switches each capable of passing a current of 5 mA need to be provided for each of the memory peripheral circuits in the eight ways (memory macros) in conventional implementation. Consequently, the circuit area occupied by eight power supply switches is needed. In the meantime, a leak current of approximately 10 μA flows in the memory peripheral circuits in standby state.

However, in the cache memory pertaining to the second exemplary embodiment, only a single common power supply switch needs to be provided for the memory peripheral circuits in eight memory macros. That is, the power supply switch which controls power supply to the memory peripheral circuits is configured with transistors having a capacity to allow the current flowing across the eight memory peripheral circuits, when one of the memory peripheral circuits in eight memory macros is operated. In this case, the above current is virtually equal to a current of 5 mA flowing in one memory peripheral circuit. Leak currents are ignorable because they are very small. Therefore, the circuit area occupied by the power supply switch which controls power supply to the memory peripheral circuits can be reduced than in conventional implementation (in the above example, the mounting area for the power supply switch can be reduced by a factor of 8).

For example, in a case where two memory macros operate simultaneously, transistors having a capacity to allow the current flowing in two memory peripheral circuits (5 mA×2=10 mA in the above example) can be used to implement the power supply switch for the memory peripheral circuits. In this way, the capacity of the power supply switch for the memory peripheral circuits can be set optionally depending on the number of memory macros to operate simultaneously.

As described in the foregoing paragraphs, in the second exemplary embodiment as well, it is possible to provide a semiconductor memory device in which the current capacity of the switch for feeding power to the memory peripheral circuits which drive the memory cells can be reduced and the time taken to activate the memory macros can be shortened.

Although the present invention has been described by way of the above embodiments, the invention is not limited to the configurations of the above embodiments. As a matter of course, the invention covers variants, modifications, and combinations which could be made by those skilled in the art without departing from the scope of the invention as defined by the claims of the present application.

What is claimed is:

1. A semiconductor memory device comprising:
a plurality of memory macros including memory cells and memory peripheral circuits which drive the memory cells;
first power supply switches which control power supply to the memory cells; and
a second power supply switch which controls power supply to the memory peripheral circuits,
wherein the first power supply switches are located within the memory macros, respectively, and provided between a power supply line feeding power to the memory cells and the memory cells, and
wherein the second power supply switch is located outside the memory macros and provided between the power supply line and a common power supply wiring for the memory peripheral circuits in the plurality of memory macros,
wherein the second power supply switch comprises a third power supply switch and a fourth power supply switch having a larger transistor size than the third power supply switch.

2. The semiconductor memory device according to claim 1,
wherein the second power supply switch is configured with transistors having a capacity to allow a current which may flow across any number of memory peripheral circuits, if operating simultaneously, among the memory peripheral circuits to which the second power supply switch is coupled.

3. The semiconductor memory device according to claim 1,
wherein parasitic capacitance of circuits configuring the memory cells is smaller than parasitic capacitance of circuits configuring the memory peripheral circuits.

4. The semiconductor memory device according to claim 1, further comprising:
a control circuit which controls the first through fourth power supply switches.

5. The semiconductor memory device according to claim 4,
wherein, when supplying a power supply voltage to the memory peripheral circuits, the control circuit turns the third power supply switch on and, after charging up the parasitic capacitance of the circuits configuring the memory peripheral circuits, turns the fourth power supply switch on.

6. The semiconductor memory device according to claim 5,
wherein the control circuit turns the first power switches on at the same time.

7. A semiconductor memory device comprising:
a data memory including a semiconductor memory device according to claim 5;
a tag memory which outputs a tag address specified depending on an input address;
a comparator which compares the input address and the tag address output from the tag memory and outputs a comparison result;
a way determiner which outputs a chip select signal to a memory macro, one of the memory macros in the data memory, wherein the memory macro is determined depending on the comparison result from the comparator; and
a way selector which takes input of data from the memory macros and outputs data corresponding to the memory macro determined by the way determiner.

8. The semiconductor memory device according to claim 7,
wherein the second power supply switch is configured with transistors having a capacity to allow a current flowing across the memory peripheral circuits, when one memory peripheral circuit is operated among the memory peripheral circuits to which the second power supply switch is coupled.

9. A semiconductor memory device comprising:
a memory macro having a memory cell and a memory peripheral circuit;
a first power line configured to supply power to the memory macro, the first power line being coupled to the memory cell;
a second power line coupled to the memory peripheral circuit;
a first switch coupled between the first power line and the second power line to control a voltage rise time of the second power line;
a second switch coupled between the first power line and the second power line and configured to supply a sufficient current required to operate the memory peripheral circuit; and
a control circuit configured to switch on the second switch after having switched on the first switch.

10. The semiconductor memory device according to claim 9, further comprising:
a plurality of the memory macros, each of memory peripheral circuits included in the memory macros being coupled to the second power line,
wherein the second switch having a current capability to operate memory peripheral circuits coupled to the second power line.

11. The semiconductor memory device according to claim 10,
wherein the current capability of the second switch is smaller than a total sum of a current capability that is required by each of the memory peripheral circuits coupled to the second power line when each of the memory peripheral circuits operates alone.

* * * * *